(12) United States Patent
Yamanaka et al.

(10) Patent No.: US 8,097,887 B2
(45) Date of Patent: Jan. 17, 2012

(54) LIGHT EMITTING DEVICE HAVING A MONOTONE DECREASING FUNCTION

(75) Inventors: Sadanori Yamanaka, Tsukuba (JP); Yoshinobu Ono, Tsukubamirai (JP); Kazumasa Ueda, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 434 days.

(21) Appl. No.: 12/225,697

(22) PCT Filed: Mar. 27, 2007

(86) PCT No.: PCT/JP2007/057355
§ 371 (c)(1),
(2), (4) Date: Oct. 28, 2008

(87) PCT Pub. No.: WO2007/119633
PCT Pub. Date: Oct. 25, 2007

(65) Prior Publication Data
US 2010/0059772 A1 Mar. 11, 2010

(30) Foreign Application Priority Data
Mar. 30, 2006 (JP) ................... 2006-093733

(51) Int. Cl.
*H01L 27/15* (2006.01)
*H01L 29/26* (2006.01)
*H01L 31/12* (2006.01)
*H01L 33/00* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/22* (2006.01)

(52) U.S. Cl. ............... 257/79; 257/13; 257/94; 257/99; 257/E33.001; 257/E33.006

(58) Field of Classification Search ................... 257/13, 257/79, 94, 99, E33.001, E33.006
See application file for complete search history.

(56) References Cited

U.S. PATENT DOCUMENTS 6,582,783 B2 * 6/2003 Hiraishi et al. ............... 428/1.1
6,869,812 B1 * 3/2005 Liu .................................. 438/22
(Continued)

FOREIGN PATENT DOCUMENTS
JP 2002-223000 8/2002
(Continued)

OTHER PUBLICATIONS

Office Action issued in JP 2006-093733 and translation thereof.

*Primary Examiner* — Ida M Soward
(74) *Attorney, Agent, or Firm* — Fitch, Even, Tabin & Flannery (57) ABSTRACT

The present invention provides a light emitting device. The light emitting device has a light distribution in which a light distribution $I(\theta, \phi)$ obtained when light emitted from a chip of the light emitting device is directly measured is not dependent on a direction $\phi$ and is substantially represented by $I(\theta, \phi)=I(\theta)$. $I(\theta, \phi)$ represents a light intensity distribution in a direction $(\theta, \phi)$, $\theta$ represents an angle from a direction of a normal to a light extraction surface of the light emitting device ($0 \leq \theta \leq 90°$), $\phi$ represents a rotation angle around the normal ($0 \leq \phi \leq 360°$), and $I(\theta)$ represents a monotone decreasing function with which 0 is approached when $\theta=90°$ is satisfied. In the light emitting device, of a structural body constructing the chip of the light emitting device, with regard to a size of a portion of the structural body which is transparent to light emitted from a light emitting layer, a ratio (an aspect ratio) between the size in a lateral direction and the size in a thickness direction is not less than 5 and a structure having a light scattering function is provided on a surface of the light emitting device chip or in an interior of the transparent portion of the structural body.

18 Claims, 8 Drawing Sheets

U.S. PATENT DOCUMENTS

| | | | |
|---|---|---|---|
| 6,900,941 B2 * | 5/2005 | Kaminsky et al. | 359/599 |
| 6,917,396 B2 * | 7/2005 | Hiraishi et al. | 349/64 |
| 7,170,100 B2 * | 1/2007 | Erchak et al. | 257/88 |
| 7,692,207 B2 * | 4/2010 | Erchak et al. | 257/99 |
| 7,968,896 B2 * | 6/2011 | Duong et al. | 257/95 |
| 2006/0044795 A1 | 3/2006 | Tatsuno | |
| 2006/0175625 A1 * | 8/2006 | Yokotani et al. | 257/95 |
| 2006/0204730 A1 * | 9/2006 | Nakamura et al. | 428/195.1 |
| 2006/0204745 A1 * | 9/2006 | Jones et al. | 428/328 |
| 2006/0208962 A1 * | 9/2006 | Sekiya | 345/45 |
| 2006/0284195 A1 | 12/2006 | Nagai | |
| 2007/0026167 A1 * | 2/2007 | Bourdelais et al. | 428/1.3 |
| 2008/0044936 A1 * | 2/2008 | Nakae et al. | 438/46 |
| 2009/0014740 A1 * | 1/2009 | Erchak et al. | 257/98 |
| 2009/0021141 A1 * | 1/2009 | Emoto et al. | 313/503 |
| 2009/0023103 A1 * | 1/2009 | Toda | 430/619 |
| 2009/0080073 A1 * | 3/2009 | Irita et al. | 359/485 |
| 2009/0209420 A1 * | 8/2009 | Kalgutkar et al. | 503/201 |

FOREIGN PATENT DOCUMENTS

| | | |
|---|---|---|
| JP | 2002-324915 | 11/2002 |
| JP | 2004-095765 | 3/2004 |
| JP | 2005-079202 | 3/2005 |
| JP | 2006-019459 | 1/2006 |
| JP | 2006-067551 | 3/2006 |
| WO | WO 2005/022654 | 3/2005 |

* cited by examiner

LIGHT EMITTING DEVICE HAVING A MONOTONE DECREASING FUNCTION

CROSS-REFERENCE TO RELATED APPLICATIONS

This is a U.S. National Phase of International Application PCT/JP2007/057355, filed Mar. 27, 2007, and claims the benefit of priority under 35 U.S.C. §119 based on Japanese Application No. 2006-093733, filed Mar. 30, 2006, the entire disclosures of which applications are hereby incorporated herein by reference.

TECHNICAL FIELD

The present invention relates to a light emitting device and, in particular, to a compound semiconductor light emitting device for a white color light emitting diode used particularly for lighting or the like.

BACKGROUND ART

In recent years, a compound semiconductor light emitting device, especially a light emitting diode (LED) has been improved in light emitting efficiency and light output, and is used for a large size display, backlight, or the like. Since it can also be used for general lighting with further improvements in light output and efficiency, development aiming at the improvements has been conducted.

The LED is a small point light source much smaller than a conventional light source such as a fluorescent light, an incandescent lamp, or the like, and exhibits a particular light distribution having directivity larger than that of the conventional light source.

A structural body for controlling the light distribution has been conventionally formed on the outside of a LED chip to manage to obtain a light source, a display, a light emitting apparatus each having a desired light distribution property. For example, a structural body such as a resin lens, a reflecting mirror, a light diffusion plate, or the like are mounted on the outside to focus or diffuse light to provide various light sources, displays, and light emitting apparatuses each having the desired light distribution property. In this case, precise axial and positional alignment of the LED chip with the lens or the reflecting mirror is required in order to obtain the desired light distribution property, and therefore the problem has been encountered that variations in the light distribution property becomes large in terms of manufacturing.

In addition, even in the case where the axial and positional alignment of the structural body for the control of the light distribution property is precisely performed, since light emitted from a light emitting diode chip presents an irregular and ununiform light distribution which reflects a chip configuration, an electrode configuration, finished quality of an end portion, or the like, the problem of the large variations in the light distribution property has remained still unsolved.

DISCLOSURE OF THE INVENTION

An object of the present invention is to provide a light emitting device chip capable of solving the problem of an irregular and ununiform light distribution property at a stage before an external structural body for controlling the light distribution property is mounted, i.e., at a stage of direct light from the light emitting device chip, and reducing variations in the light distribution property.

Another object of the present invention is to provide a light emitting device with which the same level of brightness can be sensed when a light source is viewed from any direction without particular brightness in a specific direction which is unnaturally provided, especially a light emitting device for use in lighting.

The present inventors have achieved the present invention as a result of their dedicated study.

That is, the present invention provides [1] a light emitting device having a light distribution in which a light distribution I ($\theta$, $\phi$) obtained when light emitted from a light emitting device chip is directly measured is not dependent on a direction $\phi$, and is substantially represented by I ($\theta$, $\phi$)=I ($\theta$).

I ($\theta$, $\phi$) represents a distribution of light intensity in a direction ($\theta$, $\phi$), $\theta$ represents an angle from the direction of a normal to a light extraction surface of the light emitting device ($0 \leq \theta \leq 90°$), $\phi$ represents a rotation angle around the normal ($0 \leq \phi \leq 360°$), and I ($\theta$) represents a monotone decreasing function with which 0 is approached when $\theta=90°$ is satisfied.

In addition, the present invention provides [2] a light emitting device in which, of a structural body constructing a light emitting device chip, with regard to a size of a portion of the structural body which is transparent to light emitted from a light emitting layer, a ratio (an aspect ratio) between the size in a lateral direction and the size in a thickness direction is not less than 5, and a structure having a light scattering function is provided on the surface of the light emitting device chip or in the interior of the transparent portion of the structural body.

DESCRIPTION OF REFERENCE NUMERALS

1 sapphire substrate
2 light scattering structure
3 compound semiconductor layer
4 light emitting layer
5 transparent structural body
6 p-electrode
7 n-electrode
8 adhesive layer
9 metal substrate view 1

MODE OF CARRYING OUT THE INVENTION

A light emitting device according to the present invention has a light distribution in which a light distribution I ($\theta$, $\phi$) obtained when light emitted from a light emitting device chip is directly measured (hereinafter referred to as a "light distribution of direct light") is not dependent on a direction $\phi$, and is substantially represented by I ($\theta$, $\phi$)=I ($\theta$). I ($\theta$, $\phi$) represents a distribution of light intensity in a direction (θ, φ), θ represents an angle from the normal to a light extraction surface of the light emitting device (0≦θ≦90°), φ represents a rotation angle around the normal (0≦φ≦360°), and I (θ) represents a monotone decreasing function with which 0 is approached when θ=90° is satisfied.

Figure 1:
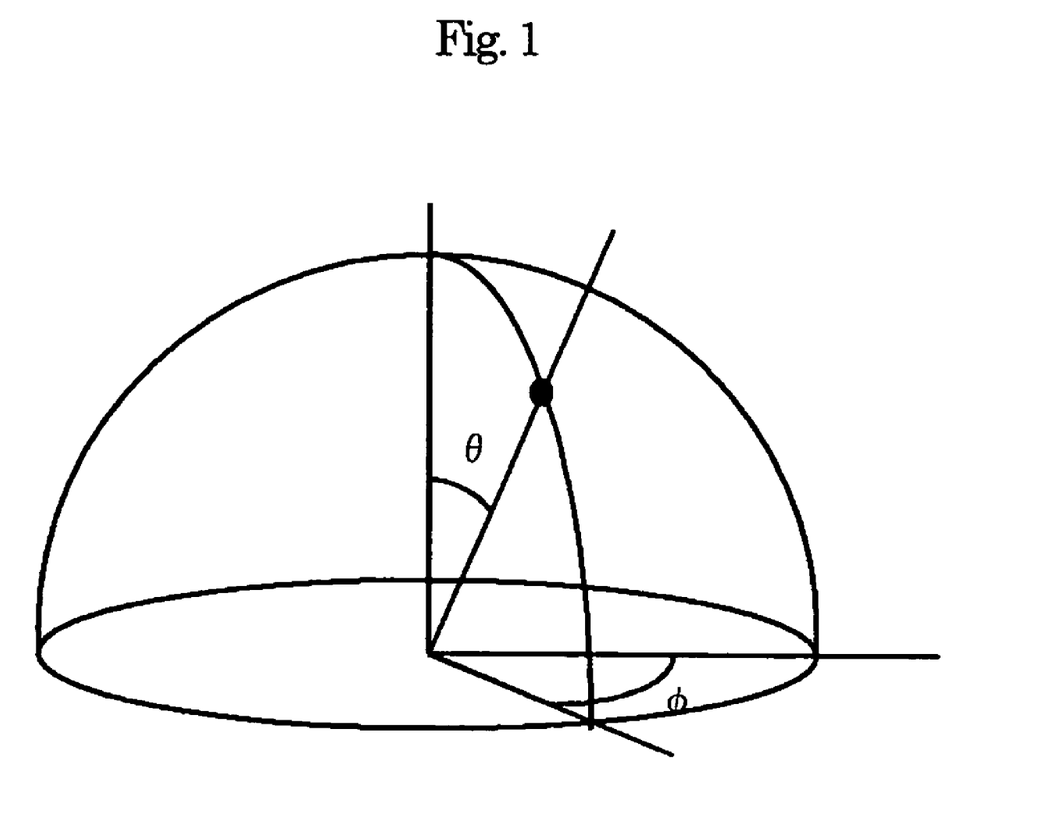
FIG. 1 is an illustrative view of a light distribution.

The light distribution is a distribution on the basis of a direction of the intensity of light emitted from the light extraction surface of the light emitting device, and is represented by the light intensity I (θ, φ) in a direction uniquely determined by two angles θ and φ shown in FIG. 1.

The light emitting device obtained by the present invention is characterized in that the direct light from the light emitting device chip provides a substantially identical level of brightness when a light source surface is viewed from any direction without placing a structural body for controlling a light distribution property on the outside of the light emitting device chip. The light distribution obtained by the present invention has extremely small variations in the direction φ, and dependence on the direction θ is represented by a function which provides monotone decrease in relation to θ.

The light distribution of the direct light of the light emitting device chip is represented by I (θ, φ)=I (θ). I (θ) is a monotone decreasing function with which 0 is approached when θ=90° is satisfied. The light distribution property in the direction θ can be generally represented by a formula shown below.

$$I(\theta,\phi)=A\cos^n\alpha\theta+B\sin^m\beta\theta$$

wherein A and B are constants, n and m are positive numbers, and α and β are positive numbers, the term $\cos^n\alpha\theta$ represents a component having the maximum value in the direction of the normal to the light extraction surface, and the term $\sin^m\beta\theta$ represents a component having the maximum value in a lateral direction, i.e., an inward direction of the light extraction surface. Each of n and m represents the directivity of each of the components. A circular light distribution represented in polar coordinates is given when the value thereof is 1, a light distribution with high directivity is given when the value thereof is higher than 1, and a light distribution with low directivity is given when the value thereof is lower than 1. α and β satisfy α=β=1 when a peak is only at the position of θ=0° or 90°, and α and β are values other than 1 when the peak is at positions other than those.

In the light distribution of the direct light of the light emitting device chip, the term sin θ in the formula shown above does not exist so that the light distribution is represented only by the term cos θ. Since the light distribution monotonously decreases in the range of θ from 0° to 90° and approaches 0 in the direction of 90°, α=1 is satisfied.

Specifically, in the light distribution of the direct light from the light emitting device chip, I (θ) is substantially represented by I (θ)=$I_0 \cos^n \theta$. $I_0$ represents light intensity in the direction of θ=0° and n represents a positive number. The value of n is preferably 0.5≦n≦2.

In the light emitting device, the direct light from the light emitting device chip provides the substantially identical level of brightness when the light source surface is viewed from any direction without the structural body for controlling the light distribution property placed on the outside of the light emitting device chip, and "the structural body for controlling the light distribution property placed on the outside" mentioned herein means a structural body which is placed on the outside of the light emitting device chip, which is sufficiently larger than the light emitting device chip, and which is not integral with the light emitting device chip such as a resin lens, a reflecting mirror, a light diffusion plate, or the like.

With regard to whether or not a phosphor dispersed in a resin is considered to be an external structural body, a structural body obtained by manufacturing the light emitting device chip and then embedding the chip in a phosphor dispersion resin is considered to be the external structural body since the volume of the resin portion is sufficiently larger than that of the light emitting device, and the light emitting device chip is embedded in the phosphor dispersion resin after the light emitting device chip is manufactured in the manufacturing step and therefore it can not be said that the light emitting device is integral with the phosphor dispersion resin.

However, in the case where a thin layer of the resin with the phosphor dispersed therein is formed on the surface of the light emitting device chip, it can not be said that the volume of a phosphor layer is sufficiently larger than that of the light emitting device chip. In addition, in the case where the phosphor layer is formed at a wafer stage where the wafer is not divided into chips yet, and then the wafer is divided into chips afterward, it can be said that the light emitting device chip is integral with the phosphor layer. Therefore, the structural bodies in these cases are not considered to be the external structural bodies.

In order to obtain the direct light from the light emitting device chip providing the substantially identical level of brightness when the light source face is viewed from any direction, the configuration of the portion of the structural body which is transparent to the light to be emitted is important. In the present invention, the portion of the structural body transparent to the light to be emitted means the whole transparent portion of components constructing the light emitting device chip such as a substrate, a semiconductor crystal, a protection film, and the like. For example, in an InGaN blue-color-light emitting diode grown on a sapphire, the transparent portion of the structural body corresponds to an integral structural body of a nitride semiconductor and sapphire, and as another example, in the case of the InGaN blue-color-light emitting diode formed on a metal substrate using a wafer bonding technique, the transparent portion of the structural body corresponds only to the portion of the nitride semiconductor.

The ratio between the lateral direction (i.e., an inward direction of the surface) and the direction of a layer thickness each of the configuration of the portion of the structural body transparent to light to be emitted is important. The size of the lateral direction (i.e., the inward direction of the surface) means the size represented by a typical indicator for representing the size of a two-dimensional configuration. There are two indicators in general, and the size in the present invention is represented by the smaller indicator.

For example, the size is represented by a diameter in the case of a circle, the size is represented by a length of a side in the case of a square, the size is represented by a length of a short side in the case of a rectangle, and the size is represented by a short diameter in the case of an ellipse. A preferable range of the ratio (an aspect ratio) between the size of the lateral direction and the size of the direction of the layer thickness is not less than 5, more preferably not less than 10, and even more preferably not less than 15. When the aspect ratio is lower than 5, since the proportion of light radiated from a side surface other than the light extraction surface increases, Lambert light distribution can not be achieved.

When the aspect ratio is increased as described above, an influence of the light extracted from the side surface can be reduced so that the substantially identical level of brightness can be sensed when the light source surface is viewed from any direction. It is further preferable to form a structure having a function of scattering light to be emitted on the surface of the light emitting device chip or in the interior of the transparent structural body while the aspect ratio is increased.

The structure having the function of scattering light includes a structure where fine particles are arranged on the surface of the light emitting device chip, or a structure where fine particles are dispersed in the interior of the transparent structural body. Besides, there can be included a large number of roughness structures which are formed on the surface of the light emitting device chip or at an interface between materials having different refractive indexes and substantially parallel with the light extraction surface in the interior of the transparent structural body, and have side surfaces inclined with respect to the surface or the interface.

The formation of the structure having the function of scattering light is effective in providing the substantially identical brightness when the light source surface is viewed from any direction as described above and, aside from this, it also has the effect of improving the light extraction efficiency to increase the light output and the light emitting efficiency of the light emitting device.

That is, when the structure having the function of scattering light is not formed on the light emitting device chip, light traveling mainly in the lateral direction is attenuated by the repetition of total reflection (multiple reflection) on the crystal surface of a compound semiconductor, and is not effectively extracted. Conversely, when the structure having the function of scattering light is formed, the effect of the total reflection is reduced and the light is effectively extracted from the light extraction surface so that the light extraction efficiency is increased.

In order to obtain white color light emission, it is performed to disperse phosphor particles which are excited by light from a light emitting diode and emit light with another wavelength resulting from wavelength conversion around the light emitting diode. By using such a phosphor particle dispersion layer, in the same as in the formation of the structure having the light scattering function, the surface of the light emitting device chip becomes no more flat and the effect of providing the substantially identical brightness when the light source surface is viewed from any direction is produced. Further, it is preferable to combine the formation of the phosphor particle dispersion layer and the increase in the aspect ratio of the transparent portion of the structural body of the light emitting device chip.

When the phosphor layer is non-particulate, the effect of providing the substantially identical level of brightness when the light source surface is viewed from any direction is low since the layer usually does not have the function of scattering light. When such a non-particulate phosphor layer is used, it is preferable to form a structure having the function of scattering light on the surface thereof or at the interface with the light emitting device. In this case as well, it is preferable to combine the formation of the structure and the increase in the aspect ratio of the transparent portion of the structural body of the light emitting device chip.

Examples of the non-particulate phosphor layer include a thin layer having the same composition as that of a particulate phosphor formed by a thin-film fabrication method such as a sputtering method, a laser ablation method, or the like, a multi-layered structure of a compound semiconductor thin film to be used for the light emitting layer of the light emitting diode, a thin film layer containing an ultra-fine particulate phosphor of which a particle diameter is sufficiently small compared with the wavelength of light to be emitted and has almost no function of scattering light, and the like.

With regard to the fine particle for scattering light, the control of the size, material, and density thereof is important for providing the substantially identical level of brightness when the light source surface is viewed from any direction. With regard to the configuration of the fine particle for scattering light, although various configurations such as a spherical configuration, a plate-like configuration, a needle-like configuration, an indefinite configuration, and the like are available, the spherical configuration can be preferably used.

With regard to the size of the fine particle for scattering light, the size of not less than the wavelength of the light to be emitted is required, and the average particle diameter preferably falls in the range of approximately not less than 10 nm and not mere than 10000 nm. It is preferable to have the particle diameter of not less than 10 nm since the effect of scattering is improved, and it is also preferable to have the particle diameter of not more than 10000 nm since the number of particles contained in the light emitting device chip is increased so that the overall effect of scattering is enhanced and it becomes easier to obtain an uniform light distribution.

As the material of the fine particle for scattering light, a material having a light transmitting property or a light reflecting property with respect to the light emitted from the light emitting device is preferable, and an oxide, a nitride, a carbide, a boride, a chalcogenide, and the like can be used.

Among them, the particle made of silica, alumina, zirconia, titania, ceria, magnesia, zinc oxide, tin oxide, or yttrium aluminum garnet is preferable. Silica is more preferable since it is easy to obtain a spherical fine particle with high light transmitting property from silica.

With regard to the state of dispersion of the fine particles for scattering light, although the fine particles may be dispersed in the three-dimensional space in the interior of the transparent structural body of the light emitting device chip, it may also be two-dimensionally placed only in a specific plane in the interior of the transparent structure. When the fine particles are two-dimensionally placed, a preferable surface density is approximately not less than $2 \times 10^6/cm^2$ and not more than $2 \times 10^{10}/cm^2$, though it depends on the average particle diameter. With the surface density of not more than $2 \times 10^6/cm^2$, the function of scattering light is lowered.

Methods for introducing the fine particle for scattering light into the interior of the light emitting device include a method which performs crystal growth after placing the fine particle on a substrate for crystal growth in accordance with the spin coating or dip method to embed the light scattering particle, a method which stops the crystal growth in progress, places the fine particle on a crystal surface in accordance with the spin coating or dip method, and then resume the crystal growth to embed the light scattering particle, and the like.

A method for placing the light scattering particle on the surface of the light emitting device includes a method which applies the particle to the top surface or back surface thereof after performing crystal growth, or the like.

In addition to the methods for introducing the light scattering fine particle described above, a method for forming a large number of roughness structures which are formed on the surface of the light emitting device chip or at an interface between materials having different refractive indexes and substantially parallel with the light extraction surface in the interior of the transparent structural body, and which have side surfaces inclined with respect to the surface or the interface is effective in providing the substantially identical level of brightness when the light source surface is viewed from any direction. As the configuration of each of the roughness structures, a protruding configuration with an inclined side surface such as a conical configuration or conical trapezoidal configuration is especially preferable.

The height of the roughness is preferably not less than 50 nm and not more than 2000 nm. This range is preferable since the effect of the present invention can be easily obtained.

The inclination angle of the side surface of the roughness is preferably not less than 15° and not more than 75°. Although the inclination angle of the side surface may be fixed, the angle may be changed depending upon the position in the direction of the height of the protruding portion.

The density of the protruding roughness having the side surfaces is preferably in the range of approximately not less than $2 \times 10^6/cm^2$ and not more than $2 \times 10^{10}/cm^2$. With the density of not more than $2 \times 10^6/cm^2$, the function of scattering light is lowered.

Methods for forming the protruding roughness having the inclined side surfaces described above include a method for forming the roughness on the crystal surface by adjusting the crystal growth condition of a semiconductor, a method for forming the roughness by etching after forming a mask by ordinary photolithography, a method for forming fine roughness by a nanoimprint method, a method in which fine particle are cast onto the crystal surface by the spin coating or dip method and etching is performed by using this as a mask, and the like.

The protruding roughness having the inclined side surfaces can be formed on (1) the surface of the substrate for crystal growth, (2) the surface in the process of crystal growth, or (3) the crystal surface after crystal growth or the back surface of the substrate for the growth.

In the cases of (1) and (2), the roughness is formed at the interface having different refractive indexes in the interior of the light emitting device chip. In the case of (3), the roughness is formed on the surface of the light emitting device.

EXAMPLES

Figure 2:
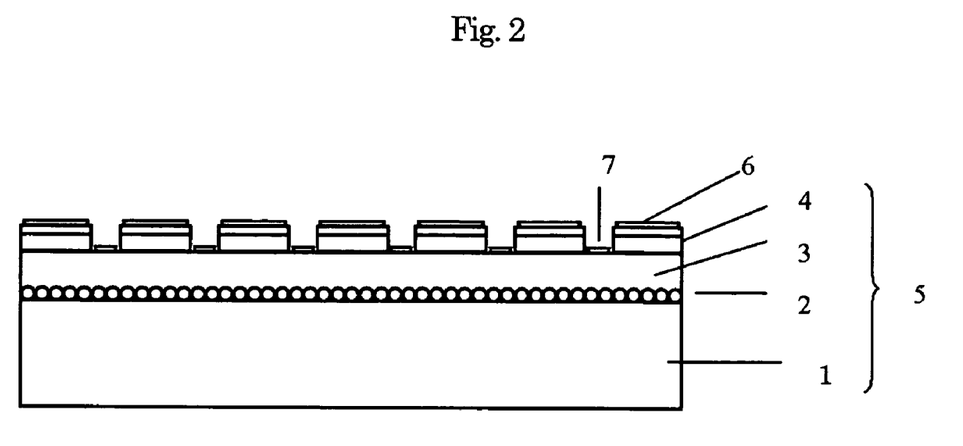
FIG. 2 is a schematic cross-sectional view of a structure of a device in Example 1.

Hereinafter, an example of the present invention will be described using FIG. 2. However, the present invention is not limited thereto.

Example 1

As an substrate, a substrate obtained by mirror polishing the C-face of a two-inch sapphire 1 having a thickness of 430 μm was used. A silica particle contained in colloidal silica (PL-20™ (product name) manufactured by Fuso Chemical Co. Ltd., a first particle diameter of 370 nm, a particle concentration of 24% by weight) was used as inorganic particle. With the substrate loaded on a spinner and the colloidal silica diluted to 10% by weight and applied onto the substrate, spin drying was performed. Observation with a SEM found out that the coverage of the substrate surface by the silica particle was about 39%.

A nitride semiconductor layer was epitaxially grown on the substrate, whereby the silica particle was embedded in the nitride semiconductor layer. The epitaxial growth was performed by a normal-pressure MOVPE method. By setting a susceptor temperature to 485° C. and using hydrogen as a carrier gas at 1 atmospheric pressure, the carrier gas, ammonia, and TMG were supplied to grow a GaN buffer layer having a thickness of 500 Å. After setting the susceptor temperature to 900° C., the carrier gas, ammonia, and TMG were supplied to grow an undoped GaN layer. After setting the susceptor temperature to 1040° C. and pressure in a furnace to ¼ atmospheric pressure, the carrier gas, ammonia, and TMG were supplied to grow the undoped GaN layer having a thickness of 5 whereby a multi-layered substrate containing a layer composed of the silica particle in a GaN crystal was obtained.

An n-type semiconductor layer, an InGaN light emitting layer (MQS structure), and a p-type semiconductor layer were subsequently grown on the multi-layered substrate, whereby a nitride semiconductor multi-layered substrate for a blue color LED having a light emitting wavelength of 440 nm was obtained.

A light emitting device (LED wafer) composed of the nitride semiconductor was obtained by dividing the nitride semiconductor multi-layered substrate for the blue color LED into eight portions, performing an etching process with respect to one of the eight portions to expose an n-type contact layer, and forming translucent p- and n-electrodes. The dimensions of the transparent portion of the LED wafer were 25 mm×13 mm×0.43 mm and the aspect ratio thereof was 30 (=13/0.43). Since the thickness of the nitride semiconductor crystal was not more than 10 μm which is small when compared with the thickness of the sapphire substrate, the thickness of the transparent portion of the LED wafer was about 0.43 μm.

Figure 4:
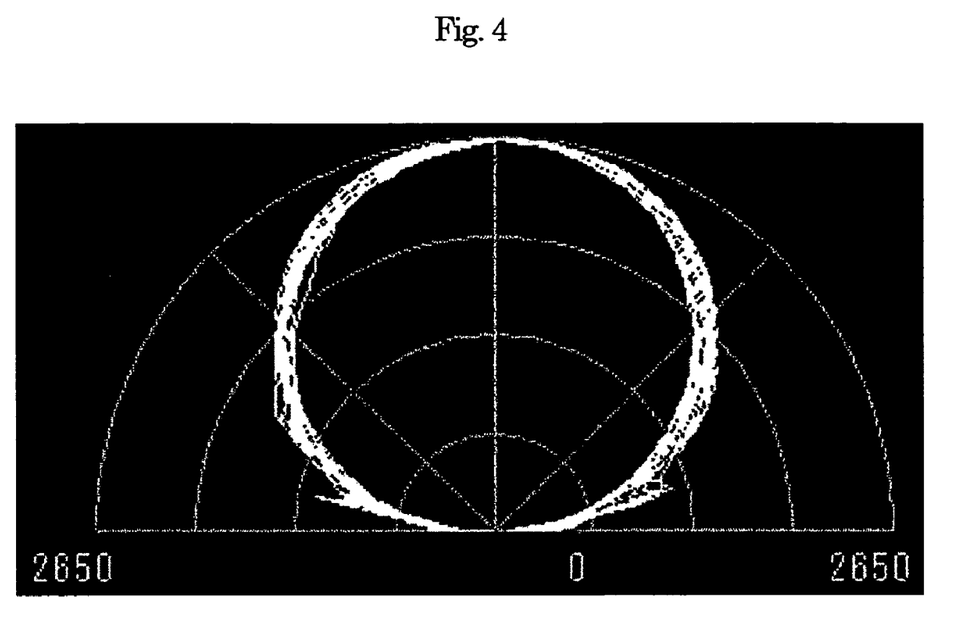
FIG. 4 shows a light distribution in Example 1.

In a state where a forward voltage is applied to the p-electrode portion having a diameter of 200 μm and the n-electrode portion therearound which are located in a substantially central portion of the LED wafer to cause light emission, a light distribution property was measured by causing a photodiode as a light receiving device to scan in directions θ and φ. In the direction φ, the range from 0 to 90° was measured with a step of 1.5°, while in the direction φ, the range from 0 to 360° was measured with the step of 10°. The result is shown in FIG. 4. FIG. 4 represents a light emitting intensity in the direction θ in polar coordinates and all data items in the direction φ are displayed in superimposing relation. As shown in FIG. 1, the shape of a circle which contacts the surface at the original is given. This indicates that the light distribution is a cos θ distribution (Lambert light distribution).

Comparative Example 1

Figure 5:
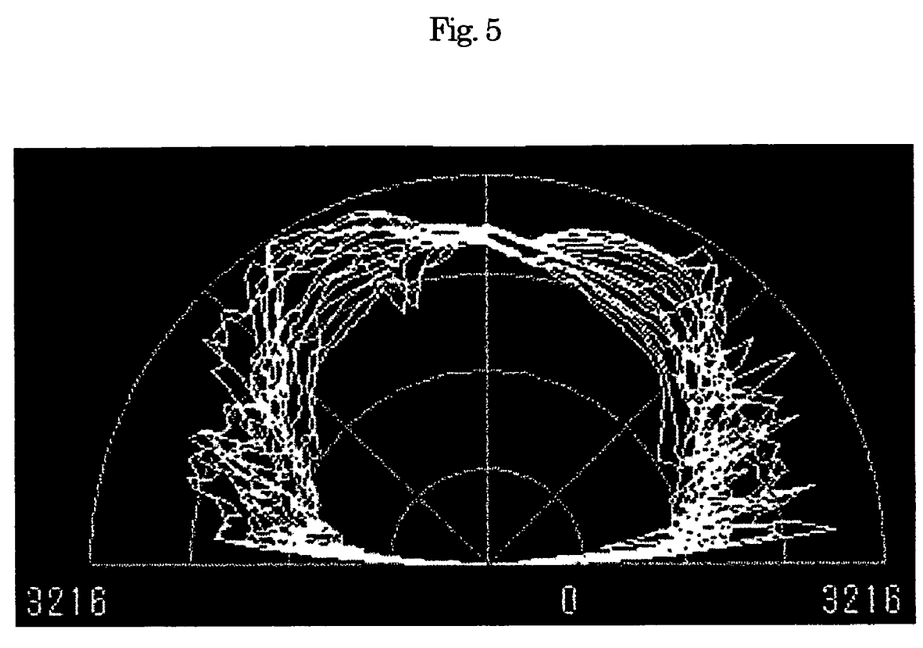
FIG. 5 shows a light distribution in Comparative Example 1.

Without applying the colloidal silica onto the sapphire, a buffer layer, the n-type semiconductor layer, the InGaN light emitting layer (MQW structure), the p-type semiconductor layer were subsequently grown on the sapphire substrate, whereby the nitride semiconductor multi-layered substrate for the blue color LED having the light emitting wavelength of 440 nm was obtained. In the same manner as in Example 1, the etching process was performed with respect to one of the eight divided portions and the translucent p- and n-electrodes were formed, whereby the light emitting device (LED wafer) composed of the nitride semiconductor was obtained. Light distribution measurement was performed by using the p-electrode located in the central portion of the LED wafer. The result of the measurement is shown in FIG. 5. The distribution in FIG. 5 has a flat configuration when compared with the circle in FIG. 4 and is out of the cos θ distribution. In addition, variations in the direction φ are large.

Comparative Example 2

After the LED was fabricated using another one of the eight divided portions of the nitride semiconductor multi-layered substrate for the blue color LED obtained in Example 1, a chip with dimensions of 2×2 mm was cut out using a scriber.

Figure 6:
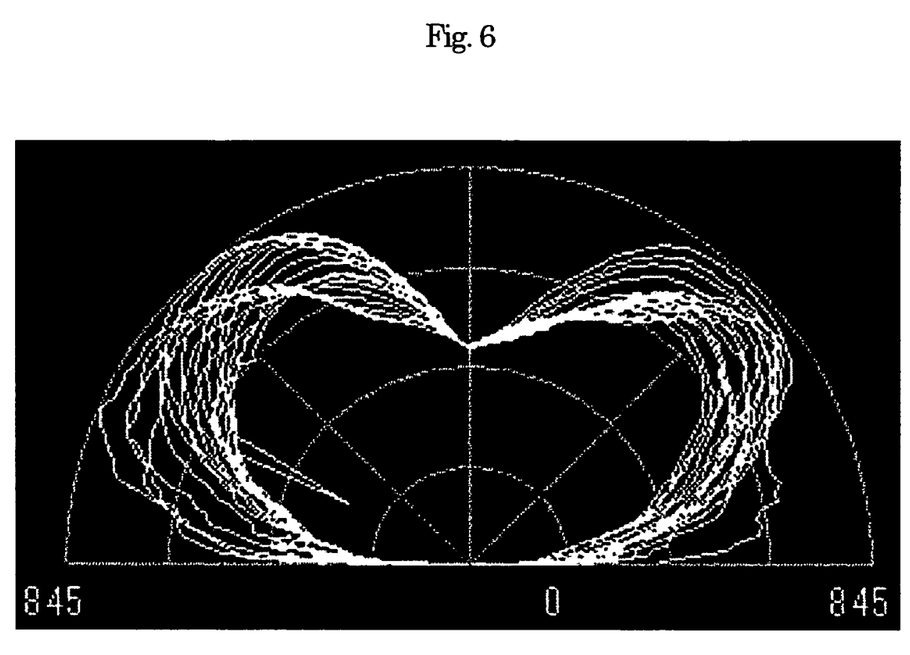
FIG. 6 shows a light distribution in Comparative Example 2.

The aspect ratio of the transparent portion of the chip is 4.7 (lateral direction:thickness=2 mm:0.43 mm). The result of measurement of the light distribution property of the chip is shown in FIG. 6. The distribution in FIG. 6 has the intensity in the lateral direction (in the vicinity of θ=45° relatively higher than that in the direction of the normal, and is out of the cos θ distribution. In addition, variations in the direction φ are large.

Thus, even the LED formed with the structure for scattering light obtained by introducing the fine particle can not have the Lambert distribution due to the effect of light emitted from a side surface when the aspect ratio of the transparent portion of the structural body is low.

Example 2

Figure 3:
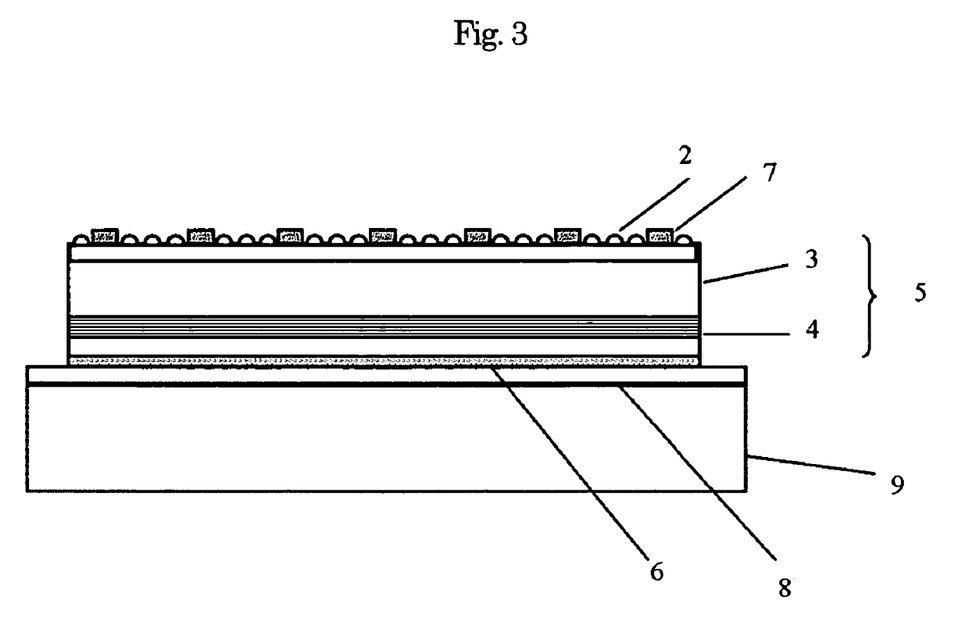
FIG. 3 is a schematic cross-sectional view of a structure of a device in Example 2.

As another example, an example of a light emitting device having the transparent structural body substantially composed of only the semiconductor crystal as a result of delaminating the sapphire substrate (an example of the case where the aspect ratio is extremely high) is shown in FIG. 3.

Without applying the colloidal silica onto the sapphire substrate, the nitride semiconductor multi-layered layer for the blue color LED was grown as in the same manner as in Comparative Example 1. The overall thickness of the layer was 4.5 μm.

After performing dry etching to form an isolation trench reaching the sapphire substrate in order to carry out device isolation, a translucent p-electrode pattern was formed on an almost entire surface of the upper surface of a mesa portion which is electrically isolated. An AuSn alloy film (Au 80%, Sn 20%) of 5000 Å as an adhesive layer was formed on the p-electrode by a vapor deposition method. A Ti/Pt layer (Ti 500 Å, Pt 500 Å) was formed between the p-electrode and the AuSn alloy layer to improve the adhesion therebetween. Hereinafter, the substrate in this state is referred to as a device-isolation substrate.

The AuSn alloy film (Au 80%, Sn 20%) of 5000 Å as the adhesive layer was formed on the surface of a molybdenum (Mo) substrate which is polished to a thickness of 100 μm and a diameter of 2 inches. The Ti/Pt layer (Ti 500 Å, Pt 500 Å) was formed between the Mo substrate and the AuSn alloy layer to improve the adhesion therebetween.

The device-isolation substrate and the Mo substrate formed with the AuSn adhesive layer were bonded with a wafer bonding apparatus such that the AuSn layers thereof contact with each other. The bonding was performed at 250° C. in a vacuum with a load of 5000 N for 30 minutes. Hereinafter, the substrate in this state is referred to as a bonded substrate.

By radiating a YAG third harmonic wave laser with a wavelength of 355 nm from the sapphire side of the bonded substrate, a laser lift-off process was performed to isolate the sapphire from the bonded substrate. In this manner, the substrate in which the blue color LED which was subjected to the device isolation via the AuSn adhesive layer was formed on the Mo substrate was fabricated. Hereinafter, the substrate in this state is referred to as an on-Mo blue color LED substrate.

After the surface of the on-Mo blue color LED substrate, i.e., the surface of n-type GaN exposed by the laser lift-off process was processed with dilute hydrochloric acid and BHF, a spin coating method was performed using the same colloidal silica slurry as used in Example 1 to apply the silica onto the surface of the LED. Next, a mesh-like pattern (a pattern having portions without a photo-resist in a mesh-like configuration) was formed thereon by photolithography. Thereafter, a BHF (buffered HF) process was performed to produce portions without the silica particle in the mesh-like configuration.

After an Al electrode and a Ni protection layer were deposited, while the photo-resist was left, and the lift-off process was performed, by removing the photo-resist with an organic solvent, the surface with a structure having an electrode in the mesh-like configuration and the colloidal silica placed within the mesh was formed.

By using the colloidal silica particle thus formed on the surface as a mask, dry etching was performed to form roughness on the surface within the mesh. The height of the formed roughness was 500 nm. The aspect ratio of the on-Mo blue color LED thus fabricated was Lateral Size of Device:Thickness=500 μm:4.5 μm, Aspect Ratio 111 (500/4.5).

Figure 7:
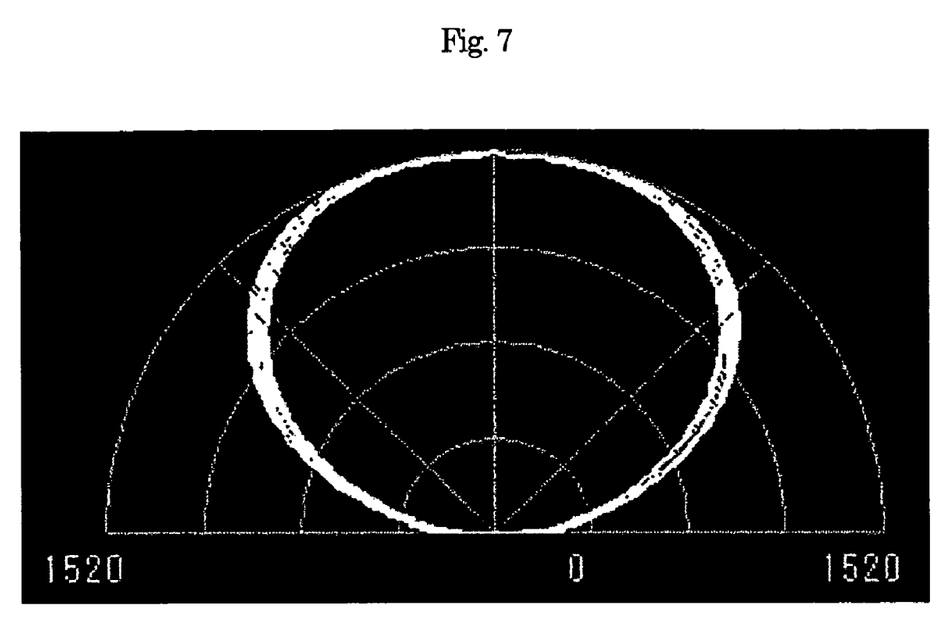
FIG. 7 shows a light distribution in Example 2.

After the on-Mo blue color LED was mounted on a flat ceramic package formed with wiring using a conductive paste, the light distribution property of the device on a sub-mount was measured by connecting lead wires thereto by wire bonding. As a result, FIG. 7 was obtained. It was found from FIG. 7 that the light distribution substantially represented the cos θ distribution, and variations were small.

Example 3

The on-Mo blue color LED substrate was fabricated in the same manner as in Example 2. However, without forming the mechanism of scattering light using the colloidal silica mask etching process performed in the subsequent step, a particulate phosphor resin dispersion layer was formed on the surface.

Figure 8:
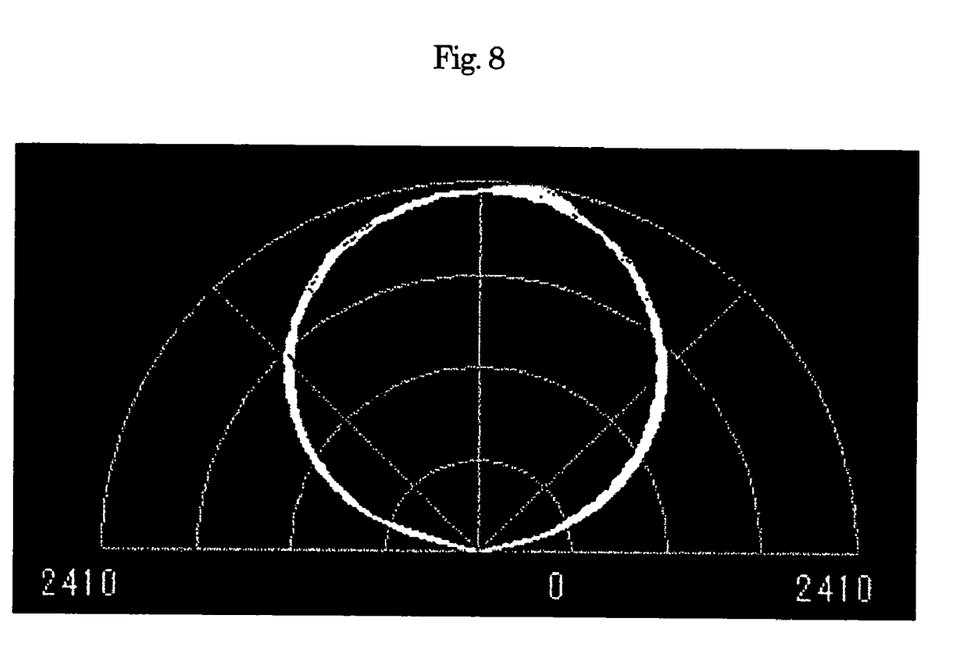
FIG. 8 shows a light distribution in Example 3.

After the on-Mo blue color LED substrate was fabricated in the same manner as in Example 2, the Al electrode in the mesh-like configuration was formed by ordinary photolithography and a lift-off process. After the on-Mo blue color LED was mounted on the flat ceramic package formed with the wiring using the conductive paste, the electrode was connected thereto by wire bonding. A slurry where a TAG:Ce phosphor is dispersed in a silicone resin was applied onto the sub-mount on which the on-Mo blue color LED substrate described above was mounted by a spin coating method. The thickness of the application was 20 μm. Since the thickness of the phosphor layer of 20 μm was small when compared with the thickness of the on-Mo blue color LED substrate of 100 μm, the phosphor layer was considered to be integral with the light emitting device chip. When the light distribution property of the obtained light emitting device was measured, the light distribution shown in FIG. 8 was obtained. It was found from FIG. 8 that the light distribution substantially represented the cos θ distribution, and variations were small.

INDUSTRIAL APPLICABILITY

Since a compound semiconductor light emitting device of the present invention has a light distribution in which the light distribution of direct light emitted from a light extraction surface of a light emitting device chip is substantially represented by $I(\theta, \phi) = I_0 \cos \theta$ without forming a structural body for changing a light distribution property around the chip, the compound semiconductor light emitting device can be preferably used for general indoor lighting without any alteration, and variations in the light distribution between chips can be significantly reduced. Even in the case where the compound semiconductor light emitting device is combined with an external structural body such as a lens or the like, it is possible to control the light distribution with precision higher than that in the case where a conventional light emitting device chip is used.

The invention claimed is:

1. A light emitting device having a light distribution in which a light distribution I $(\theta, \phi)$ obtained when light emitted from a chip of the light emitting device is directly measured is not dependent on a direction $\phi$, and is substantially represented by I $(\theta, \phi) = I_0 \cos^n \theta$, wherein:
   I $(\theta, \phi)$ represents a light intensity distribution in a direction $(\theta, \phi)$,
   $\theta$ represents an angle from a direction of a normal to a light extraction surface of the light emitting device ($0 \leq \theta \leq 90°$),
   $\phi$ represents a rotation angle around the normal ($0 \leq \phi \leq 360°$),
   $I_0$ represents the light intensity in a direction of $\theta = 0°$, and
   n represents a positive number.

2. The light emitting device of claim 1, wherein n is not less than 0.5 and not more than 2.

3. The light emitting device of claim 1, wherein a magnitude of variations of the light distribution I $(\theta, \phi)$ of direct light emitted form the chip of the light emitting device in a range of 360° in a direction $(\phi)$ in the same direction $\theta$ is not more than 20% of an average value I $(\theta)$ in the range of 360° in the direction $\phi$.

4. The light emitting device of claim 1, wherein, in a structural body constructing the chip of the light emitting device, with regard to a size of a portion of the structural body which is transparent to light emitted from a light emitting layer, a ratio (an aspect ratio) between the size in a lateral direction and the size in a thickness direction is not less than 5 and a particulate phosphor dispersion layer which absorbs light emitted from the light emitting layer and emits light at a different wavelength is formed on a surface of the light emitting chip or in an interior of the transparent portion of the structural body.

5. The light emitting device of claim 1, wherein such device includes a structural body for controlling the light distribution placed on the outside of the chip of the light emitting device.

6. The light emitting device of claim 1, wherein, in a structural body constructing the chip of the light emitting device, with regard to a size of a portion of the structural body which is transparent to light emitted from a light emitting layer, a ratio (an aspect ratio) between the size in a lateral direction and the size in a thickness direction is not less than 5, and a structure having a light scattering function is provided on a surface of the light emitting device chip or in an interior of the transparent portion of the structural body, wherein
   the structure having the light scattering function has (a) a structure where fine particles are arranged on the surface of the light emitting device chip or in a plane or within a structural body, (b) a structure where the fine particles are dispersed in a semiconductor crystal or (c) the structure having the light scattering function has a plurality of roughness structures formed on a chip surface or at an interface between materials having different refractive indexes which is substantially parallel with a light extraction surface in an interior of the chip, and having side surfaces inclined with respect to the chip surface or the interface.

7. The light emitting device of claim 6, wherein the structure having the light scattering function has a structure where fine particles are arranged on the surface of the light emitting device chip or in a plane in the transparent structural body, or a structure where the fine particles are dispersed in an semiconductor crystal.

8. The light emitting device of claim 7, wherein a main component of each of the fine particles is any of an oxide, a nitride, a carbide, a boride, and a chalcogenide.

9. The light emitting device of claim 7, wherein each of the fine particles is made of any of silica, alumina, zirconia, titania, ceria, magnesia, zinc oxide, tin oxide, and yttrium aluminum garnet.

10. The light emitting device of claim 6, wherein the structure having the light scattering function has a plurality of roughness structures formed on a chip surface or at an interface between materials having different refractive indexes which is substantially parallel with a light extraction surface in an interior of the chip, and having side surfaces inclined with respect to the chip surface or the interface.

11. The light emitting device of claim 10, wherein an average diameter of fine particles is not less than 10 nm and not more than 10000 nm.

12. A light emitting device, wherein, in a structural body constructing a chip of the light emitting device, with regard to a size of a portion of the structural body which is transparent to light emitted from a light emitting layer, a ratio (an aspect ratio) between the size in a lateral direction and the size in a thickness direction is not less than 5 and a structure having a light scattering function is provided on a surface of the light emitting device chip or in an interior of the transparent portion of the structural body, wherein
   the structure having the light scattering function has (a) a structure where fine particles are arranged on the surface of the light emitting device chip or in a plane in the transparent structural body, (b) a structure where the fine particles are dispersed in a semiconductor crystal or (c) the structure having the light scattering function has a plurality of roughness structures formed on a chip surface or at an interface between materials having different refractive indexes which is substantially parallel with a light extraction surface in an interior of the chip, and having side surfaces inclined with respect to the chip surface or the interface.

13. The light emitting device of claim 12, wherein the structure having the light scattering function has a plurality of roughness structures formed on a chip surface or at an interface between materials having different refractive indexes which is substantially parallel with a light extraction surface in an interior of the chip, and having side surfaces inclined with respect to the chip surface or the interface.

14. The light emitting device of claim 12, wherein, of the structural body constructing the chip of the light emitting device, with regard to the size of the portion of the structural body which is transparent to light emitted from the light emitting layer, the ratio (the aspect ratio) between the size in the lateral direction and the size in the thickness direction is not less than 5 and a particulate phosphor dispersion layer which absorbs light emitted from the light emitting layer and emits light at a different wavelength is formed on the surface of the light emitting chip or in the interior of the transparent portion of the structural body.

15. The light emitting device of claim 12, wherein the structure having the light scattering function has a structure where fine particles are arranged on the surface of the light emitting device chip or in a plane in the transparent structural body, or a structure where the fine particles are dispersed in an semiconductor crystal.

16. The light emitting device of claim 15, wherein an average diameter of the fine particles is not less than 10 nm and not more than 10000 nm.

17. The light emitting device of claim 15, wherein a main component of each of the fine particles is any of an oxide, a nitride, a carbide, a boride, and a chalcogenide.

18. The light emitting device of claim 15, wherein each of the fine particles is made of any of silica, alumina, zirconia, titania, ceria, magnesia, zinc oxide, tin oxide, and yttrium aluminum garnet.

* * * * *